(12) United States Patent
Kawamura et al.

(10) Patent No.: US 10,422,859 B2
(45) Date of Patent: Sep. 24, 2019

(54) DISTANCE MEASURING DEVICE AND SOLID-STATE IMAGE SENSOR

(71) Applicant: Panasonic Intellectual Property Management Co., Ltd., Osaka-shi, Osaka (JP)

(72) Inventors: Makoto Kawamura, Osaka (JP); Tomohito Nagata, Kyoto (JP); Haruka Takano, Osaka (JP); Mitsuhiko Otani, Hyogo (JP)

(73) Assignee: PANASONIC INTELLECTUAL PROPERTY MANAGEMENT CO, LTD., Osaka (JP)

( * ) Notice: Subject to any disclaimer, the term of this patent is extended or adjusted under 35 U.S.C. 154(b) by 766 days.

(21) Appl. No.: 14/977,579

(22) Filed: Dec. 21, 2015

(65) Prior Publication Data

US 2016/0178734 A1 Jun. 23, 2016

Related U.S. Application Data

(63) Continuation of application No. PCT/JP2014/002514, filed on May 13, 2014.

(30) Foreign Application Priority Data

Jun. 27, 2013 (JP) .................................. 2013-135379

(51) Int. Cl.
*G01S 7/48* (2006.01)
*G01S 17/89* (2006.01)
(Continued)

(52) U.S. Cl.
CPC ............ *G01S 7/4808* (2013.01); *G01S 17/08* (2013.01); *G01S 17/89* (2013.01);
(Continued)

(58) Field of Classification Search
CPC ........ G01S 7/4808; G01S 7/484; G01S 7/486; G01S 7/4861; G01S 7/4865; G01S 7/4868; G01S 17/08; G01S 17/89; G01S 7/4863
See application file for complete search history.

(56) References Cited

U.S. PATENT DOCUMENTS 6,373,557 B1 4/2002 Mengel et al.
6,717,190 B2 * 4/2004 Shizukuishi ...... H01L 27/14812
257/232
(Continued)

FOREIGN PATENT DOCUMENTS

JP 2011-243862 A 12/2011
JP 2012-168049 A 9/2012
(Continued)

OTHER PUBLICATIONS

International Search Report dated Aug. 12, 2014 issued in Intenational Patent Application No. PCT/JP2014/002514 (partial English translation).
(Continued)

*Primary Examiner* — Eric L Bolda
(74) *Attorney, Agent, or Firm* — McDermott Will & Emery LLP

(57) ABSTRACT

In a distance measuring device, a drive controller generates an emission timing signal and an exposure timing signal in accordance with a measurement condition. A light source irradiates light in response to the emission timing signal. A solid-state image sensor has a group of pixels arranged in a matrix pattern and divided into a plurality of regions on a line-by-line basis, and performs an exposure process on a selected one of the regions in response to the exposure timing signal. An imaging signal processor obtains distance information by performing an arithmetic operation on a signal output from the solid-state image sensor. The drive controller generates mutually different measurement conditions to the plurality of the regions of the solid-state image sensor.

12 Claims, 15 Drawing Sheets

(51) Int. Cl.
*H01L 27/146* (2006.01)
*G01S 17/08* (2006.01)
*H04N 5/235* (2006.01)
*H04N 5/353* (2011.01)

(52) U.S. Cl.
CPC ..... *H01L 27/14601* (2013.01); *H04N 5/2353* (2013.01); *H04N 5/2354* (2013.01); *H04N 5/3535* (2013.01)

(56) References Cited

U.S. PATENT DOCUMENTS

| | | | |
|---|---|---|---|
| 2001/0046317 A1* | 11/2001 | Kamon | G01B 11/25 382/154 |
| 2005/0162638 A1* | 7/2005 | Suzuki | G01C 3/08 356/4.04 |
| 2012/0177252 A1 | 7/2012 | Korekado et al. | |
| 2012/0235021 A1 | 9/2012 | Kasai | |
| 2014/0267613 A1* | 9/2014 | Cohen | G01S 7/4863 348/46 |
| 2015/0229856 A1 | 8/2015 | Kasai | |

FOREIGN PATENT DOCUMENTS

| | | |
|---|---|---|
| JP | 2012-195734 A | 10/2012 |
| WO | 99/34235 A1 | 7/1999 |

OTHER PUBLICATIONS

Extended European Search Report dated May 30, 2016 issued in European Patent Application No. 14817491.5.

* cited by examiner

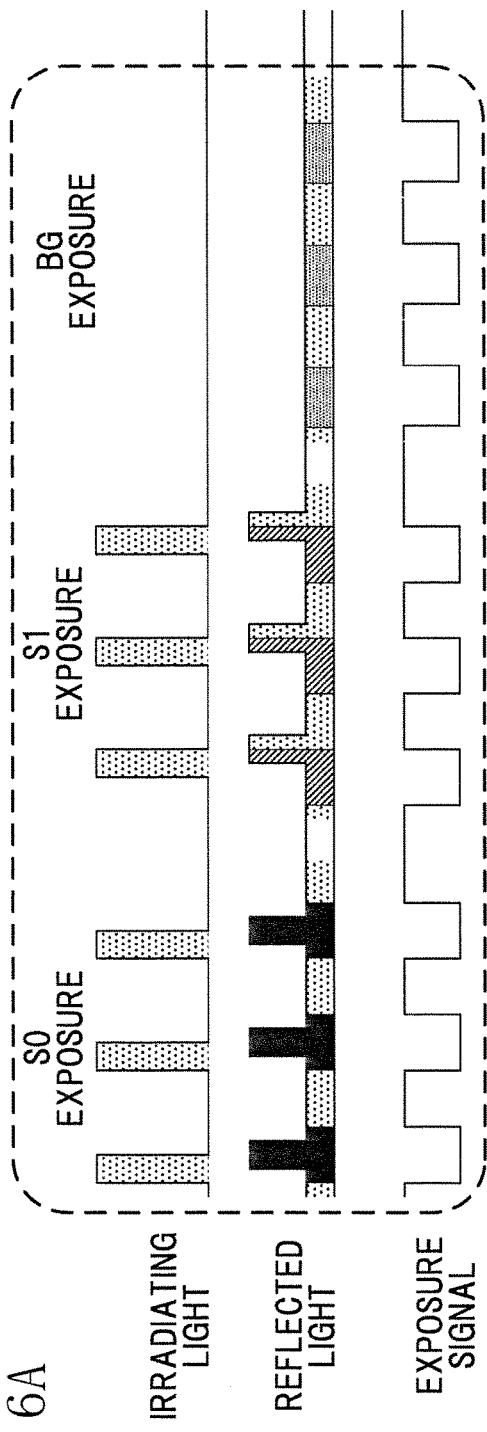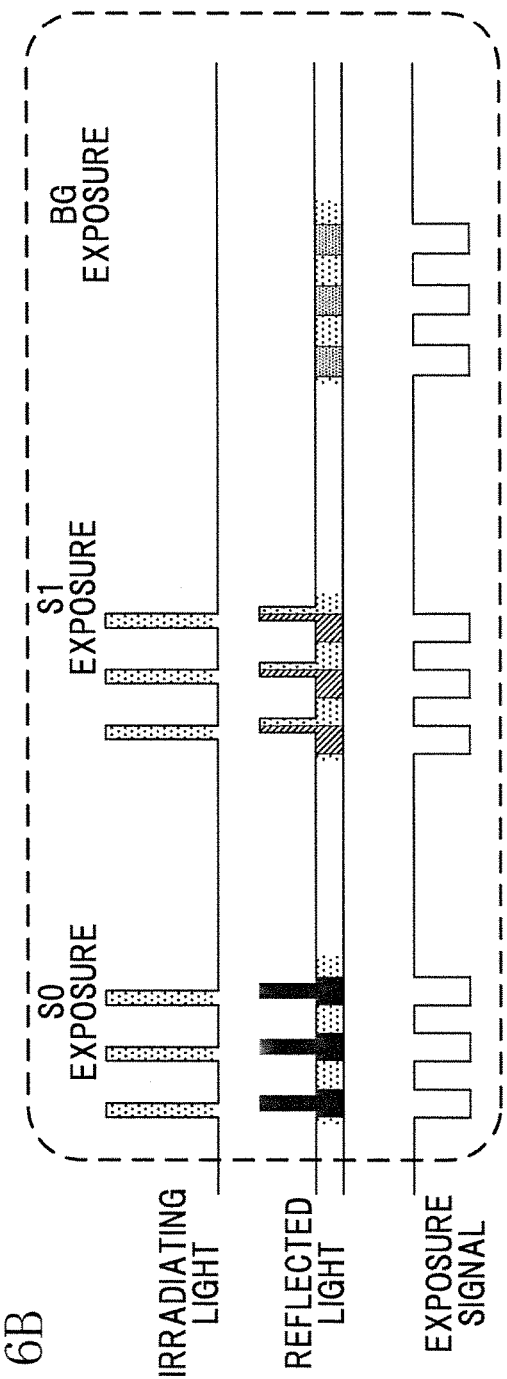

DISTANCE MEASURING DEVICE AND SOLID-STATE IMAGE SENSOR

CROSS-REFERENCE TO RELATED APPLICATIONS

This is a continuation of International Application No. PCT/JP2014/002514 filed on May 13, 2014, which claims priority to Japanese Patent Application No. 2013-135379 filed on Jun. 27, 2013. The entire disclosures of these applications are incorporated by reference herein.

BACKGROUND

The present disclosure relates to a distance measuring device and more particularly relates to a distance measuring device which measures a distance by the delay of light using a light source and a solid-state image sensor.

In recent years, three-dimension (3D) distance measuring devices (rangefinders) for measuring distances and determining shapes have caught a lot of attention, thanks to the appearance of KINECT by Microsoft. Moreover, in order to meet the demands for lowering the prices of such 3D devices, a single sensor is increasingly required to handle the distance measurements under various conditions, e.g., no matter whether the object is located at a short distance or a long distance and whether the object forms part of a bright area or a dark area. To meet such a request, a method currently under study involves multiple exposures to measure the distance. However, the method uses a frame memory to measure the distance under different conditions, and, as a result, the cost tends to increase as a distance measurement set as a whole.

In Japanese Unexamined Patent Publication No. 2012-195734 (FIG. 19), for example, an image signal processor includes a frame memory. The frame memory stores digital image data to which a correction such as shading has been made. In response to a request from the image signal processor, the digital image data in the frame memory is output via an interface. Using a time-of-flight (TOF) measuring technique, for example, the image signal processor measures the TOF of light by receiving the light that has irradiated, and has then been reflected from, the object. Based on the measured TOF of the light, the image signal processor measures the distance to the object and obtains a 3D image of the object.

SUMMARY

A conventional distance measuring device, however, has a frame memory to store a difference caused by a change in exposure. This causes an increase in the size and cost of the distance measuring device, which is a problem.

In view of the foregoing background, the present disclosure provides an inexpensive distance measuring device which enables measuring a distance with a high degree of accuracy under various conditions.

In an aspect of the present disclosure, a distance measuring device which utilizes a time of flight (TOF) technique comprises: a light source configured to emit light in accordance with an emission timing signal; a drive controller configured to generate, in accordance with a predetermined measurement condition, the emission timing signal and an exposure timing signal corresponding to the emission timing signal; a solid-state image sensor having a group of pixels arranged in a matrix pattern, the group being divided into a plurality of regions on a line-by-line basis, the solid-state image sensor performing an exposure process on a selected one of the regions in response to the exposure timing signal, and outputting, as a signal, charges stored in the group of the pixels; and an imaging signal processor configured to obtain distance information by performing an arithmetic operation on the signal output from the solid-state image sensor, wherein the drive controller generates the emission timing signal and the exposure timing signal for each of the plurality of regions of the solid-state image sensor in accordance with respective different measurement conditions.

According to this aspect, the light emission and exposure processes may be performed, under mutually different measurement conditions, on a plurality of regions of the solid-state image sensor, and the charges obtained from the group of the pixels may be provided as a signal to the imaging signal processor. Hence, the distance may be calculated under multiple different measurement conditions within a single frame. As a result, this aspect allows for eliminating the need for a frame memory to store a change in exposure caused by the difference in measurement condition, and for reducing the size and cost of the distance measuring device.

In another aspect of the present disclosure, a distance measuring device which utilizes a TOF technique comprises: a light source configured to emit light in sync with an emission timing signal; a drive controller configured to generate, in accordance with a predetermined measurement condition, the emission timing signal and an exposure timing signal corresponding to the emission timing signal; a solid-state image sensor having a group of pixels arranged in a matrix pattern, performing an exposure process in response to the exposure timing signal, and outputting charges stored in the group of the pixels; and an imaging signal processor configured to perform an arithmetic operation on the signal output from the solid-state image sensor, and obtain distance information, wherein the light source and the solid-state image sensor are arranged so as to be spaced from each other, and an irradiating direction of the light source is tilted from a front side of the distance measuring device toward the solid-state image sensor This aspect allows for approximately equalizing, over the entire object of measurement, the amount of time it takes for the light emitted from the light source to irradiate the object, be reflected from the object and then be incident on the solid-state image sensor. Hence, the distance may be accurately measured.

The present disclosure provides a distance measuring device of a reduced size at a lower cost.

BRIEF DESCRIPTION OF THE DRAWINGS

FIGS. 6A and 6B illustrate another exemplary change in measurement condition according to the first embodiment.

DETAILED DESCRIPTION

Embodiments will now be described in detail with reference to the drawings.

First Embodiment

Figure 1:
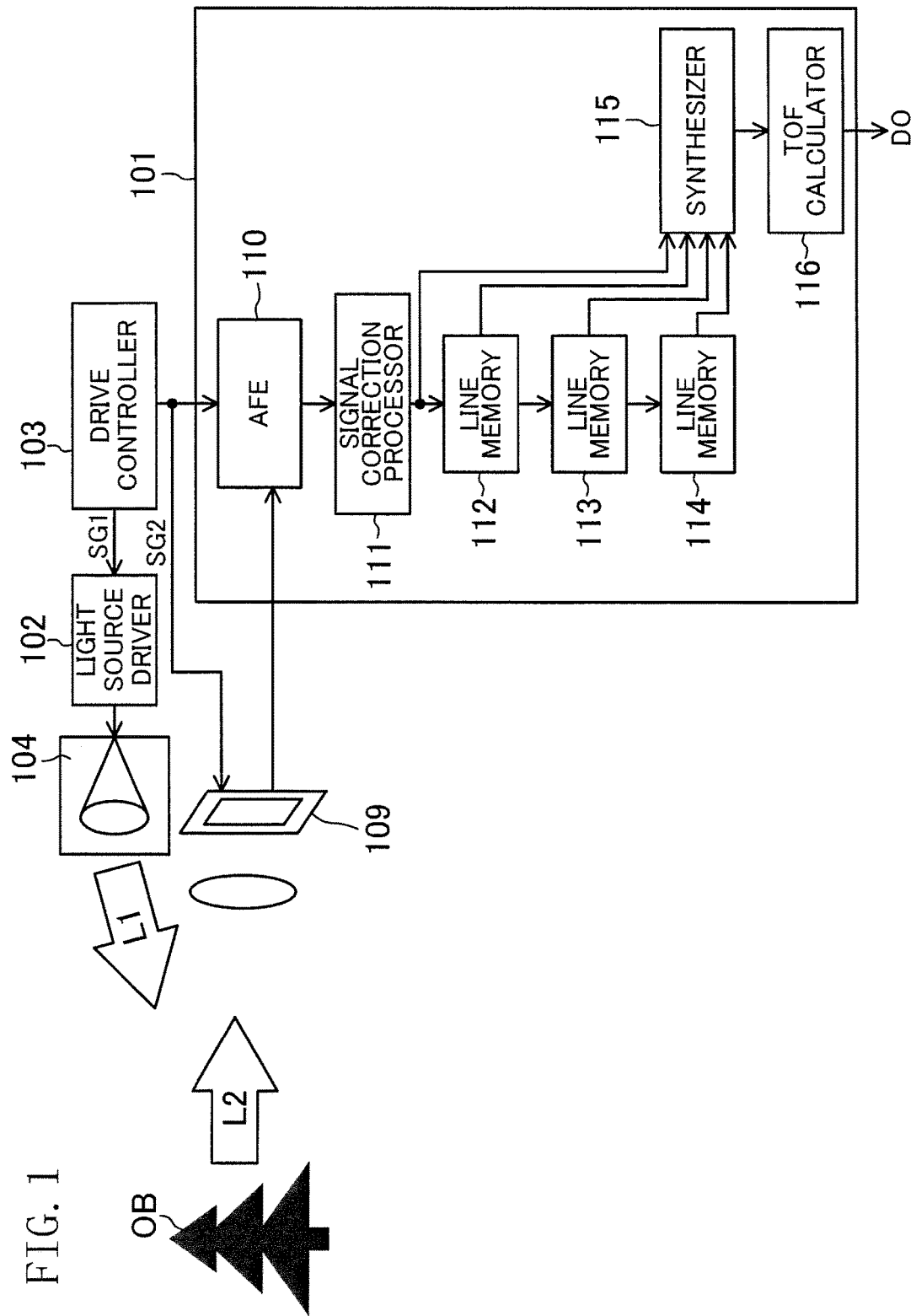
FIG. 1 illustrates an exemplary configuration for a distance measuring device according to a first embodiment.

FIG. 1 is a block diagram illustrating a configuration for a distance measuring device according to a first embodiment. The distance measuring device illustrated in FIG. 1 utilizes the TOF technique, and includes an imaging signal processor 101, a light source driver 102, a drive controller 103, a light source 104, and a solid-state image sensor 109. The imaging signal processor 101 includes an analog front end (i.e., AFE) 110, a signal correction processor 111, line memories 112, 113, and 114, a synthesizer 115, and a TOF calculator 116.

In accordance with a predetermined condition, the drive controller 103 generates an emission timing signal SG1, and an exposure timing signal SG2 corresponding to the emission timing signal SG1. The light source driver 102 is controlled in accordance with the emission timing signal SG1 to make the light source 104 irradiate an object OB with light L1. The irradiating light L1 is a pulsed light beam with a predetermined emission pulse width.

The irradiating light L1 is reflected from the object OB. This reflected light (L2) is received by the solid-state image sensor 109. The solid-state image sensor 109 includes a group of pixels arranged in a matrix pattern. The solid-state image sensor 109 performs an exposure process in response to the exposure timing signal SG2, and outputs, as a signal, stored in the group of the pixels to the imaging signal processor 101.

The charge signal supplied to the imaging signal processor 101 is converted by the AFE 110 from an analogue signal into digital data, and the digital data thus obtained is passed to the signal correction processor 111. The signal correction processor 111 makes level correction and filter processing. Then, in this embodiment, the data is held in the line memory 112 on a line-by-line basis in the group of the pixels of the solid-state image sensor 109. The data held in the line memory 112 is sequentially transferred, line by line again, to the line memories 113 and 114. The synthesizer 115 interpolates and synthesizes the respective outputs of the signal correction processor 111 and the line memories 112, 113, and 114. The TOF calculator 116 calculates the distance based on the data provided by the synthesizer 115, and outputs distance data D0 obtained as a result of the calculation.

Figure 2:
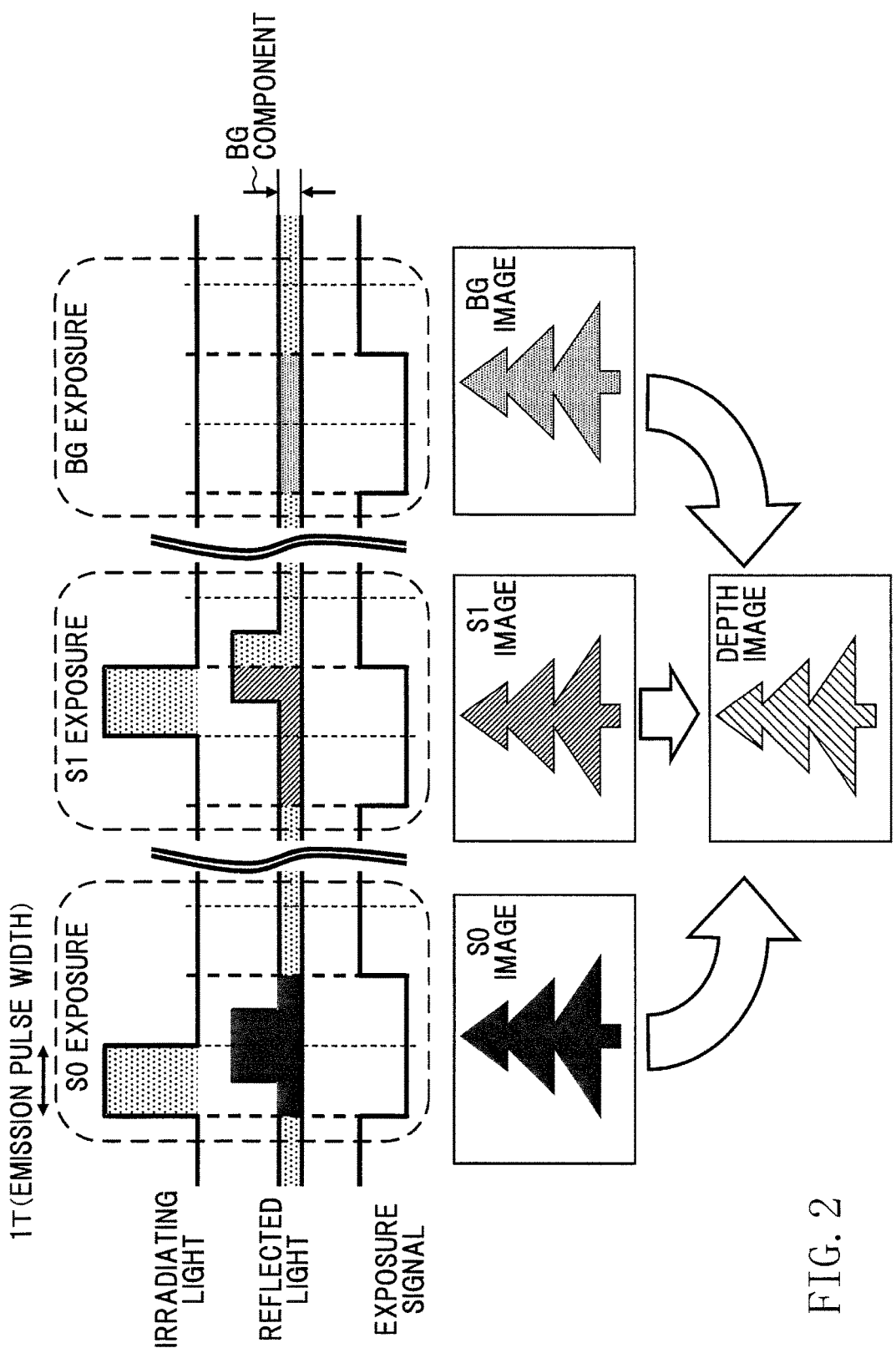
FIG. 2 illustrates an operation in accordance with a TOF technique.
Figure 3:
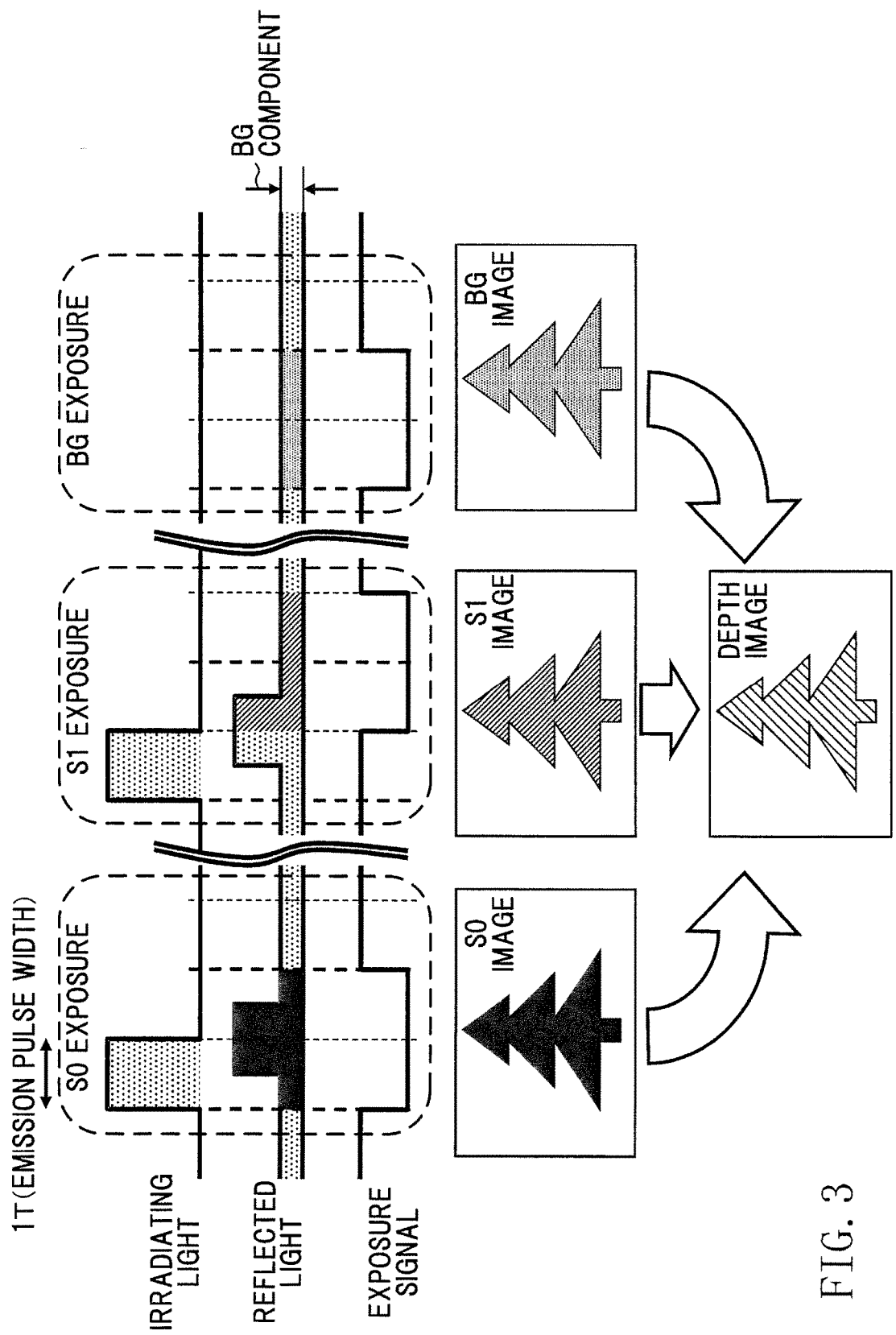
FIG. 3 illustrates an operation in accordance with the TOF technique.

Described next with reference to FIGS. 2 and 3 is how to measure the distance by the TOF technique. According to the TOF technique, an S0 exposure process, an S1 exposure process, and a BG exposure process are performed. In the S0 exposure process, the reflection of the light emitted from the light source is received entirely. In the S1 exposure, the reflection of the light emitted from the light source, is received just partially. In the BG exposure process, only background light is received without emitting any light from the light source. These three kinds of exposure processes are each performed either only once, or a number of times repeatedly, to store charges. Then, the quantities of the charges stored are converted into digital values (S0, S1, BG). Then, (S0−BG) and (S1−BG) are calculated, and, based on the ratio of these two differences, the distance is calculated. If the endpoint of an exposure signal of the S1 exposure process is present as a signal indicating the timing of exposure within a pulse period of the reflected light as illustrated in FIG. 2, the distance may be calculated by the following expression:

[Math. 1]

$$L = \frac{c \cdot T_O}{2} \times \left(1 - \frac{S1 - BG}{S0 - BG}\right) \qquad \text{Expression 1}$$

where T0 is a pulse width of the emission, and c is the velocity of light.

Furthermore, as illustrated in FIG. 3, the starting point of the exposure signal for the S1 exposure may be present as a signal indicating the timing of exposure in the pulse period of the reflected light. In such a case, the expression for calculating the distance becomes:

[Math. 2]

$$L = \frac{c \cdot T_O}{2} \times \left(\frac{S1 - BG}{S0 - BG}\right) \qquad \text{Expression 2}$$

This is how the distance is obtained.

In this embodiment, the group of the pixels of the solid-state image sensor 109 is divided into a plurality of regions on a line-by-line basis. Then, the solid-state image sensor 109 performs an exposure process on a selected one of the regions in response to the exposure timing signal SG2. The drive controller 103 may generate the emission timing signal SG1 and the exposure timing signal SG2 with mutually different measurement conditions applied to the plurality of regions of the solid-state image sensor 109.

Figure 4:
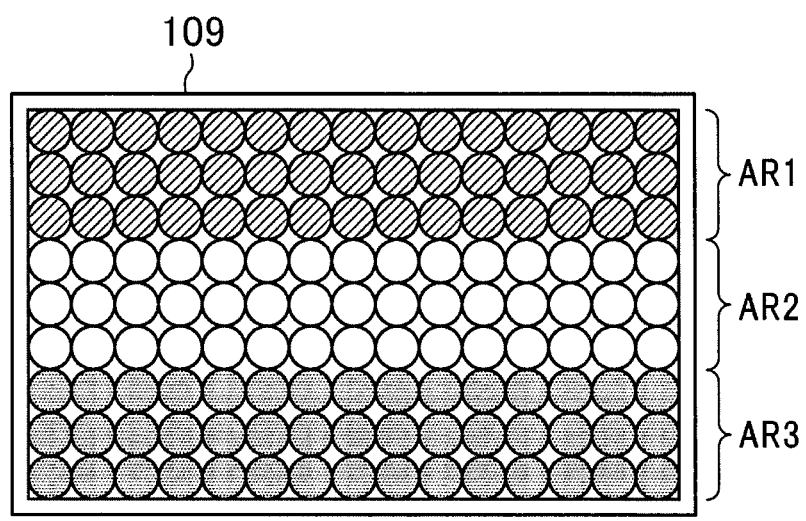
FIG. 4 illustrates how pixels may be arranged and divided into a plurality of regions in a solid-state image sensor.

FIG. 4 illustrates how the pixels may be arranged and divided into a plurality of regions in the solid-state image sensor 109. In FIG. 4, the group of pixels of the solid-state image sensor 109 is divided on a line-by-line basis into three regions AR1, AR2, and AR3. Note that the sizes and the number of the regions shall not be limited to the ones illustrated in FIG. 4.

Figure 5A:
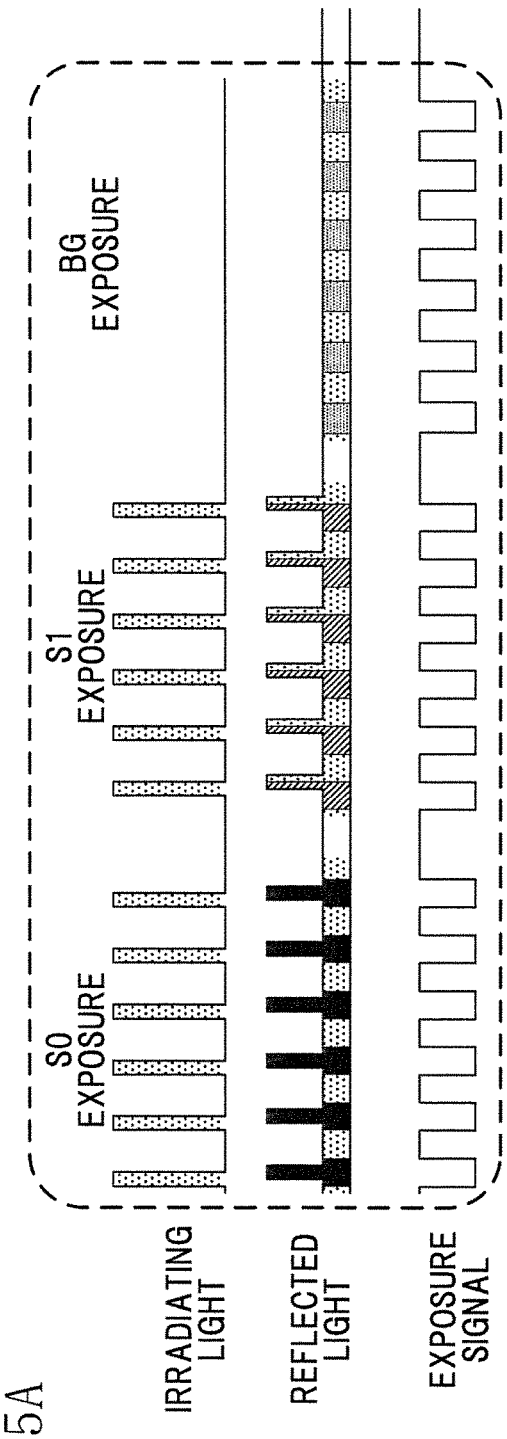
FIGS. 5A and 5B illustrate an exemplary change in measurement condition according to the first embodiment.
Figure 5B:
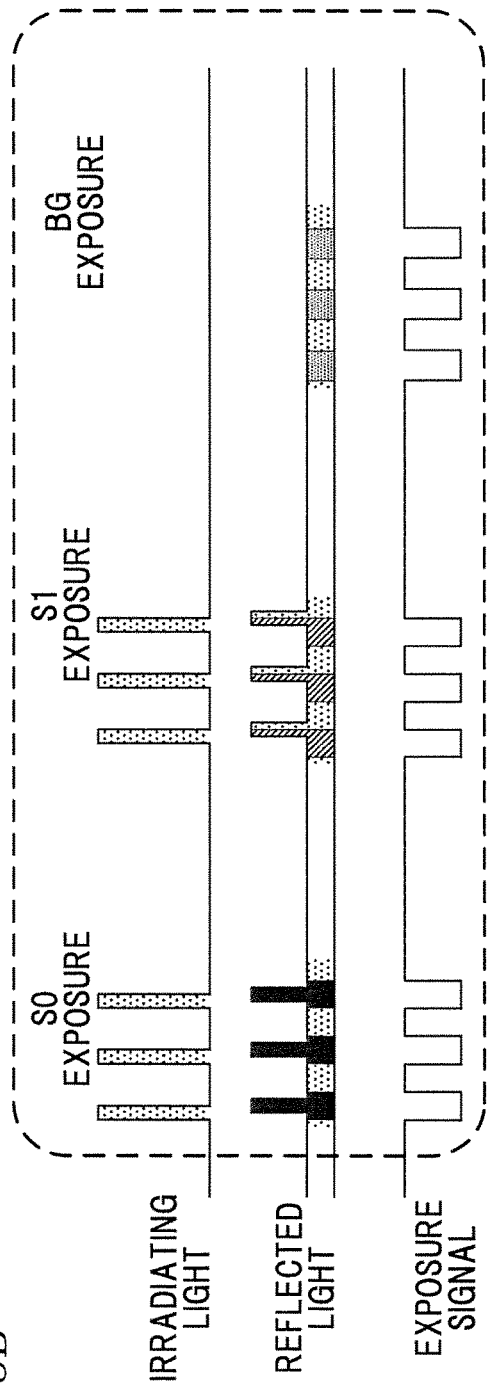

FIGS. 5A and 5B illustrate how the measurement condition may be changed in one example. In the examples in FIGS. 5A and 5B, the number of times of exposure in the S0 and S1 exposure processes is changed depending on the condition. Specifically, each type of exposure process is repeated six times under the condition shown in FIG. 5A, and is repeated three times under the condition shown in FIG. 5B. The larger the number of times the exposure process is performed repeatedly, the greater the quantity of charge stored accordingly, and the more accurately the distance can be calculated. However, once the quantity of the charge stored exceeds the upper limit of saturation, the distance can no longer be calculated correctly. Hence, by adjusting the number of times of exposure with respect to each region—namely, each of the regions AR1, AR2, and AR3 shown in FIGS. 5A and 5B, for example, —the exposure process is successfully performed with the maximum possible intensity of light at or under which no saturation is caused in any region. As a result, the distance may be measured with high accuracy.

In the example described above, the number of times of repetition of the exposure process is supposed to be changed depending on the measurement condition. However, the change shall not be limited to the number of times of repetition. For example, a change may also be made, depending on the measurement condition, to the emission pulse width of the irradiating light or to the phase of the exposure timing signal with respect to its associated emission timing signal. In this case, the measurement result under the best condition may be selected for use depending on the distance to the object of measurement. Then, the distance may be measured accurately. Furthermore, a change may also be made, depending on the measurement condition, to the combination of the number of times of repetition of the exposure process, an emission pulse width of the irradiating light, and the phase of the exposure timing signal with respect to the emission timing signal.

FIGS. 6A and 6B illustrate how the measurement condition may be changed in another example. In the example shown in examples in FIGS. 6A and 6B, the emission pulse width of the irradiating light changed depending on the condition in the S0 and S1 exposure processes. If the exposure period is too short and the distance to the object of measurement is too long, the reflected light cannot come back during the exposure period, and the distance cannot be measured correctly. Hence, for example, the distance to the object may be measured through a long distance based on the result of measurement under the condition shown FIG. 6A with a broad emission pulse width. Then, if a determination is made, based on the distance thus measured, that the object of measurement is located at so short a distance as to be sufficiently measurable even under the condition shown in FIG. 6B with a narrow emission pulse width, the result of measurement under the condition shown in FIG. 6B is adopted.

The longest distance may be measured when the delay of the reflected light is equal to the emission pulse width. The measurable distance becomes shorter as the emission pulse width becomes narrower. If the delay of the reflected light is greater than or equal to the emission pulse width, the quantity of the received light is always the same as that of the background light. As a result, the emission pulse width no longer changes with the distance and thus the distance cannot be measured. Meanwhile, the resolution becomes higher as the measurable distance becomes shorter, and the distance may be measured more precisely. Then, the distance measurement may be performed based on the best emission pulse width depending on the distance.

Figure 7A:
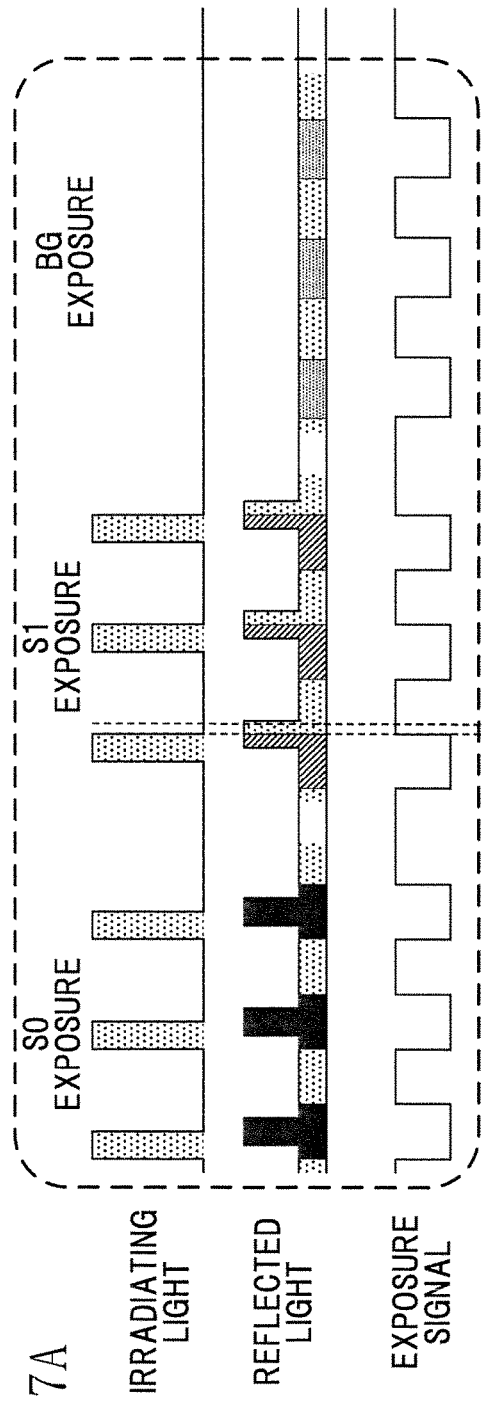
FIGS. 7A and 7B illustrate still another exemplary change in measurement condition according to the first embodiment.
Figure 7B:
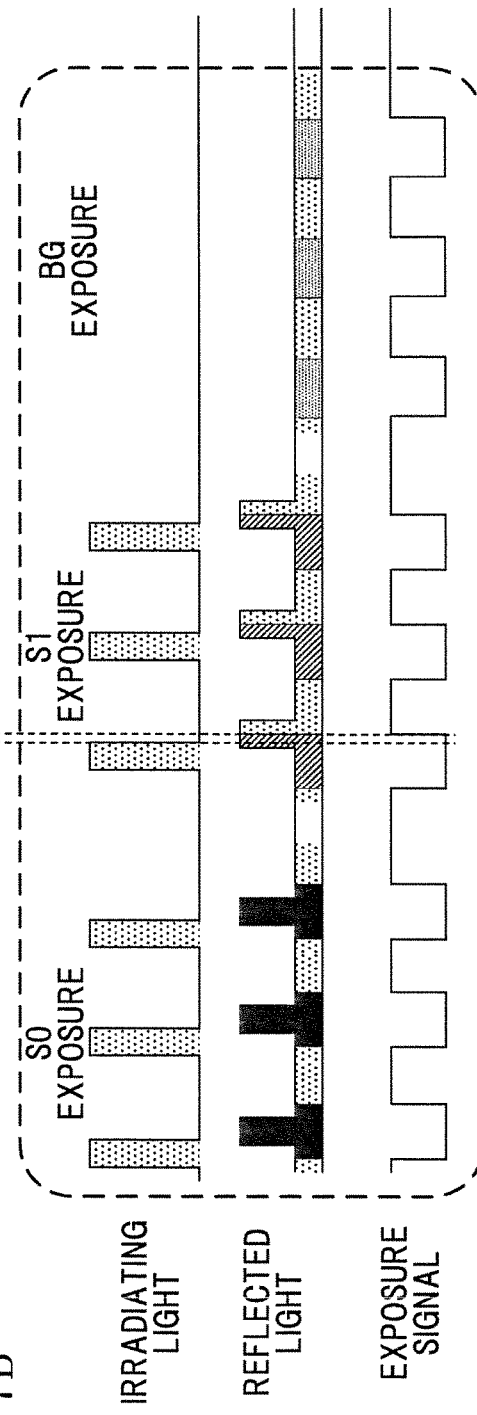
Figure 8:
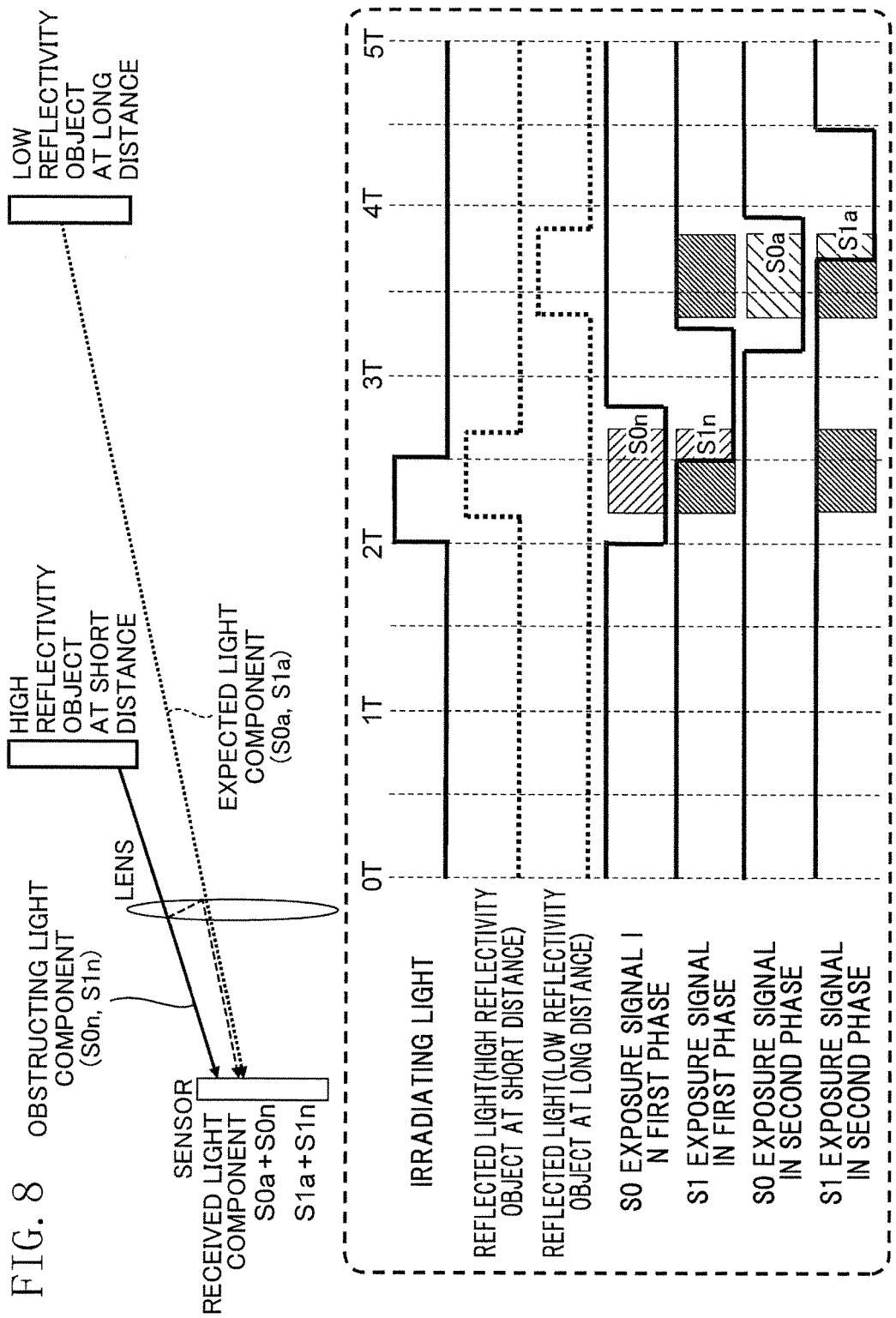
FIG. 8 illustrates an exemplary change in measurement condition according to the first embodiment.

FIGS. 7A, 7B, and 8 illustrate how the measurement condition may be changed in still another example. In the examples shown in FIGS. 7A, 7B, and 8, the phase of the exposure timing signal is changed depending on the condition with respect to its associated emission timing signal in the S0 and S1 exposure processes. The distance is measured with the phase difference set to be comparatively small between the timing of emission and the corresponding timing of exposure under the condition shown in FIG. 7A, and with the phase difference set to be comparatively large between the timing of emission and the corresponding timing of exposure under the condition shown in FIG. 7B. If the distance to the object is short, it takes a short time before the reflected light comes back, and thus the distance may be measured under the condition that the difference in phase between the light emission and exposure is comparatively small as illustrated in FIG. 7A. If the distance to the object is long, it takes a long time before the reflected light comes back, and thus the distance may be measured under the condition that the difference in phase between the light emission and exposure is comparatively large as illustrated in FIG. 7B. The combination of the results under these two conditions enables correctly measuring the distance in a broad range from a short distance to a long one. Moreover, the resolution of the distance measurement depends on the quantity of received light signals. Hence, the emission pulse width may be broadened or the number of times of light emission and exposure may be increased under the condition that the difference in phase between the light emission and exposure is comparatively large. Such a technique successfully avoids a decrease in the quantity of received light due to a lower intensity of the reflected light coming from an object at a long distance. This allows for measuring the distance with high accuracy and resolution, not only when the object is located at a short distance but also when the object is located at a long distance.

If the objects of measurement include a high reflectivity object of measurement located at a short distance and a low reflectivity object of measurement located at a long distance as illustrated in FIG. 8, a high intensity light beam reflected from the high reflectivity object of measurement located at a short distance mixes, in an optical system such as a lens, with a low intensity light beam reflected from the low reflectivity object of measurement located at a long distance. Thus, supposing these two light beams are emitted at the same time and received in the corresponding exposure timing phase, obstructing light components (S0$n$, S1$n$) produced in the S0 and S1 exposure processes by the high reflectivity object of measurement located at a short distance are added to expected light components (S0$a$, S1$a$) produced in the S0 and S1 exposure processes by the low reflectivity object of measurement located at a long distance. As a result, the distance to the low reflectivity object of measurement located at a long distance is measured to be shorter than the actual one with a significant error. Hence, the light beams are received as an S0 exposure signal and an S1 exposure signal. Specifically, the S0 exposure signal is received under the two conditions, one of which involves a phase in which the light reflected from the high reflectivity object of measurement located at a short distance is received entirely and in which the light reflected from the low reflectivity object of measurement located at a long distance is not received at all, and the other of which involves a phase in which the light reflected from the low reflectivity object of measurement located at a long distance is received entirely and in which the light reflected from the high reflectivity object of measurement located at a short distance is not received at all. The S1 exposure signal is received under the two conditions, one of which involves a phase in which the light reflected from the high reflectivity object of measurement located at a short distance is received partially and the light reflected from the low reflectivity object of measurement located at a long distance is not received at all, and the other one of which is a phase in which the light reflected from the low reflectivity object of measurement located at a long distance is received partially and in which the light reflected from the high reflectivity object of measurement located at a short distance is not received at all. This enables measuring the distance accurately with substantially no error, without allowing the obstructing light components (S0$n$, S1$n$) produced in the S0 and S1 exposure processes by the high reflectivity object of measurement located at a short distance from being added to the expected light components (S0$a$, S1$a$) produced in the S0 and S1 exposure processes by the low reflectivity object of measurement located at a long distance.

Note that the number of measurement conditions to change does not have to be two but may also be three or more. Moreover, when the measurement condition is changed, emitted pulsed light beams may be changed. Alternatively, if there are two or more light-emitting bodies, the bodies to emit light may also be changed. Still alternatively, the first half of the reflected light may be received in the S0 exposure process and the second half of the reflected light may be received in the S1 exposure process.

Furthermore, the group of the pixels of the solid-state image sensor 109 may be divided into a first region comprised of even-numbered lines and a second region comprised of odd-numbered lines, and in measuring the distance, the conditions of light emission and exposure may be changed between the even-numbered lines and the odd-numbered lines. In such a case, the measurement condition changes every line. This facilitates making interpolation for each line from upper and lower lines in the vertical direction.

Figure 9:
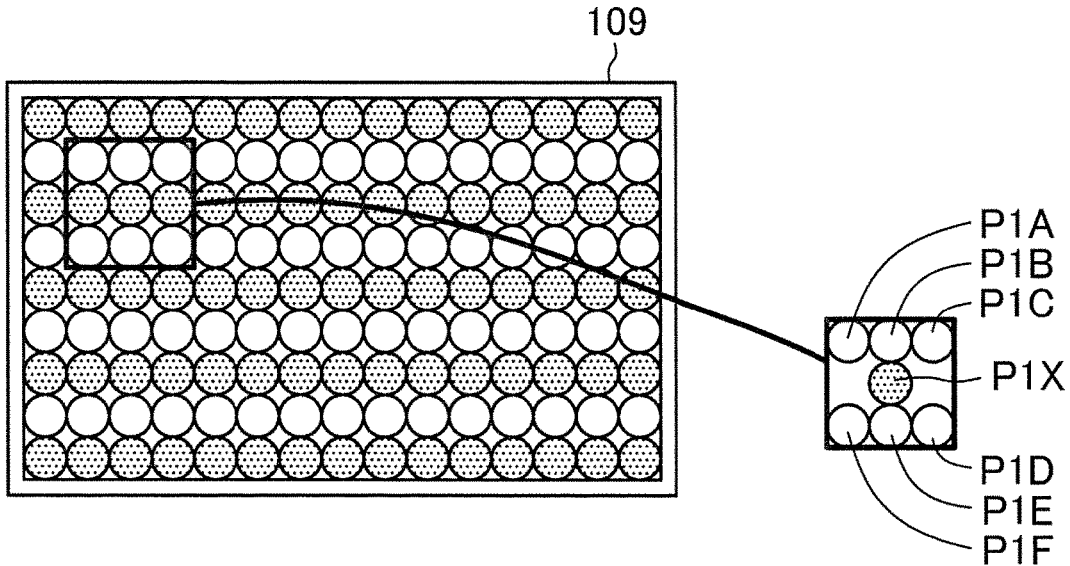
FIG. 9 illustrates how the pixels may also be arranged and divided into a plurality of regions in a solid-state image sensor.

FIG. 9 illustrates how the pixels of the solid-state image sensor 109 may be arranged and divided into a plurality of regions in another example. For example, the solid-state image sensor 109 may capture an image to measure the distance by using the even-numbered lines and the odd-numbered lines time-sequentially. In accordance with, for example, the first condition illustrated in FIG. 5A, the drive controller 103 generates the emission timing signal SG1 and the exposure timing signal SG2 for the first region comprised of the even-numbered lines. In accordance with, for example, the second condition illustrated in FIG. 5B, the drive controller 103 generates the emission timing signal SG1 and the exposure timing signal SG2 for the second region comprised of the odd-numbered lines. As a result, the image is captured on the even-numbered lines under the first condition involving a relatively large number of times of exposure, and on the odd-numbered lines under the second condition involving a relatively small number of times of exposure. The solid-state image sensor 109 continuously transfers, on a frame-by-frame basis, charges obtained for the respective pixels by capturing the image under the two conditions.

Then, values measured on the even- and odd-numbered lines are interpolated with each other, and the signals (S0, S1, BG) under the first condition and the signals (S0, S1, BG) under the second condition can be obtained for all of the pixels.

In the example illustrated in FIG. 9, a pixel P1X located on an odd-numbered line and having only the measurement result under the second condition is interpolated by six pixels P1A, P1B, P1C, P1D, P1E, and P1F surrounding the pixel P1X and having the measurement result under the first condition. When this arithmetic processing is executed, the line memories 112, 113, and 114 are used. Since data is transferred in the order of the lines, a horizontal line having the pixels P1A, P1B, and P1C is provided through the line memories 112 and 113, and then stored in the line memory 114. Here, a horizontal line having the pixel P1X is provided through the line memory 112, and then stored in the line memory 113. A horizontal line having the pixels P1D, P1E, and P1F is stored in the line memory 112.

The synthesizer 115 performs an interpolation operation on the pixel data read from the line memories 112, 113, and 114. The interpolation may be made by the following expression:

$$P1X=(P1A+2 \cdot P1B+P1C+P1D+2 \cdot P1E+P1F)/8.$$

Note that each reference sign in this expression indicates the data of a corresponding pixel.

Such a calculation allows for obtaining results under both the first and second conditions for all of the pixels. Hence, for example, for a pixel having a saturated S0 signal under the first condition involving a relatively large number of times of exposure, adopted is the result under the second condition involving a relatively small number of times of exposure. For the other pixels, the result under the first condition is adopted. This enables selecting the result under the most suitable condition for all the pixels, thus contributing to enhancing the accuracy.

Furthermore, in the solid-state image sensor 109, the pixels on the even-numbered lines may be shifted from the pixels on the odd-numbered lines by half a pixel in a line direction. This arrangement allows for easy interpolation using the four pixels located on top right, top left, bottom right, and bottom left sides of a pixel to be interpolated.

Figure 10:
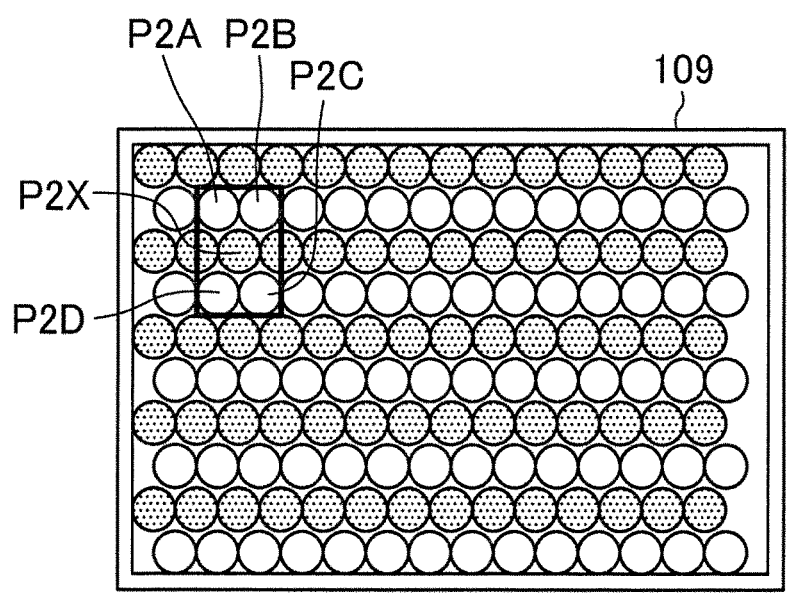
FIG. 10 illustrates how the pixels may also be arranged and divided into a plurality of regions in a solid-state image sensor.

FIG. 10 illustrates how the pixels of the solid-state image sensor 109 may be arranged and divided into a plurality of regions in still another example. Compared with the pixel arrangement shown in FIG. 9, the pixel arrangement shown in FIG. 10 allows for obtaining both of the results, through a simple calculation, under the first and second conditions for all the pixels, and further allows for enhancing the horizontal resolution.

For example, a pixel P2X located on an odd-numbered line and having only the measurement result under the second condition is interpolated by four pixels P2A, P2B, P2C, and P2D surrounding the pixel P2X and having the measurement result under the first condition. The interpolation calculation may be performed by the following expression:

$$P2X=(P2A+P2B+P2C+P2D)/4.$$

Note that each reference sign in this expression indicates the data of a corresponding pixel. Such a simple calculation (i.e., obtaining the average of the four pixel data) allows for obtaining both the first and second conditions for all of the pixels.

Moreover, the distance measuring device may also be configured such that multiple measurement conditions are applied to a single region of the solid-state image sensor 109. Such a configuration allows for correcting measurement results under the multiple conditions through a comparison between those measurement results.

Figure 11:
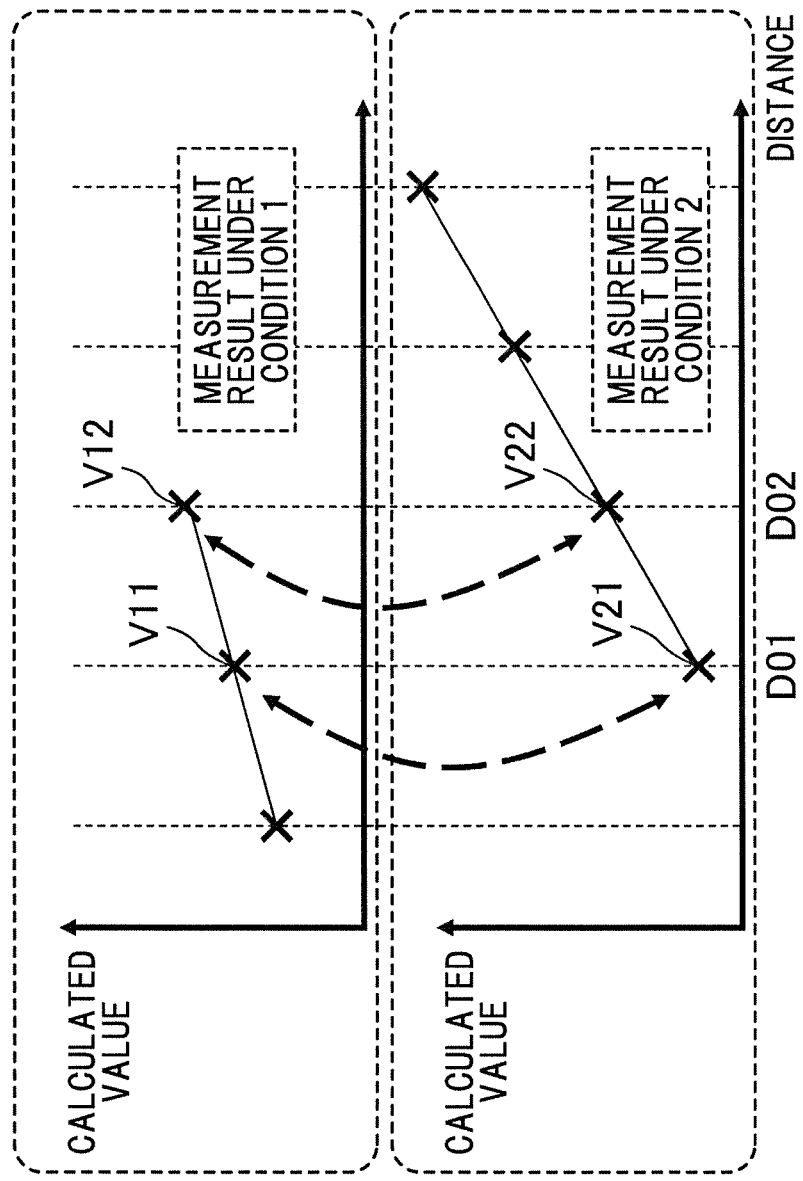
FIG. 11 illustrates an exemplary concept of applying multiple measurement conditions to a single region.

FIG. 11 illustrates an exemplary concept of applying multiple measurement conditions to a single region. Here, distances are each calculated at the same measurement point based on the measurement results under Conditions 1 and 2, and then the resulting distances are compared with each other and corrected. If the measurement is made under multiple different conditions, the distance to the same object of measurement should be the same. Therefore, the distances calculated based on the results of the arithmetic operation should be the same, except a situation where the results of the measurement are erroneous due to the saturation of a sensor, for example. Thus, a parameter is calculated to obtain the same distance as a result of the arithmetic operation.

Specifically, for example, at measurement points D01 and D02 in FIG. 11, obtained are calculated values V11 and V12 under Condition 1, and calculated values V21 and V22 under Condition 2. Here, the distances calculated based on the calculated values V11 and V21 should be the same. Furthermore, the distances calculated based on the calculated values V12 and V22 should also be the same. Hence, based on these measurement results, a function of the distances and calculated values may be obtained. A variable of this function corresponds to the parameter. This thus allows for measuring the distance while making calibration in real time.

Moreover, the distance measuring device may be configured to share a single background image, captured without emitting light from the light source, in common in making an arithmetic operation under multiple different conditions. Such a configuration eliminates the need for capturing the background image under each condition, and allows for shortening an image capturing time.

Figure 12:
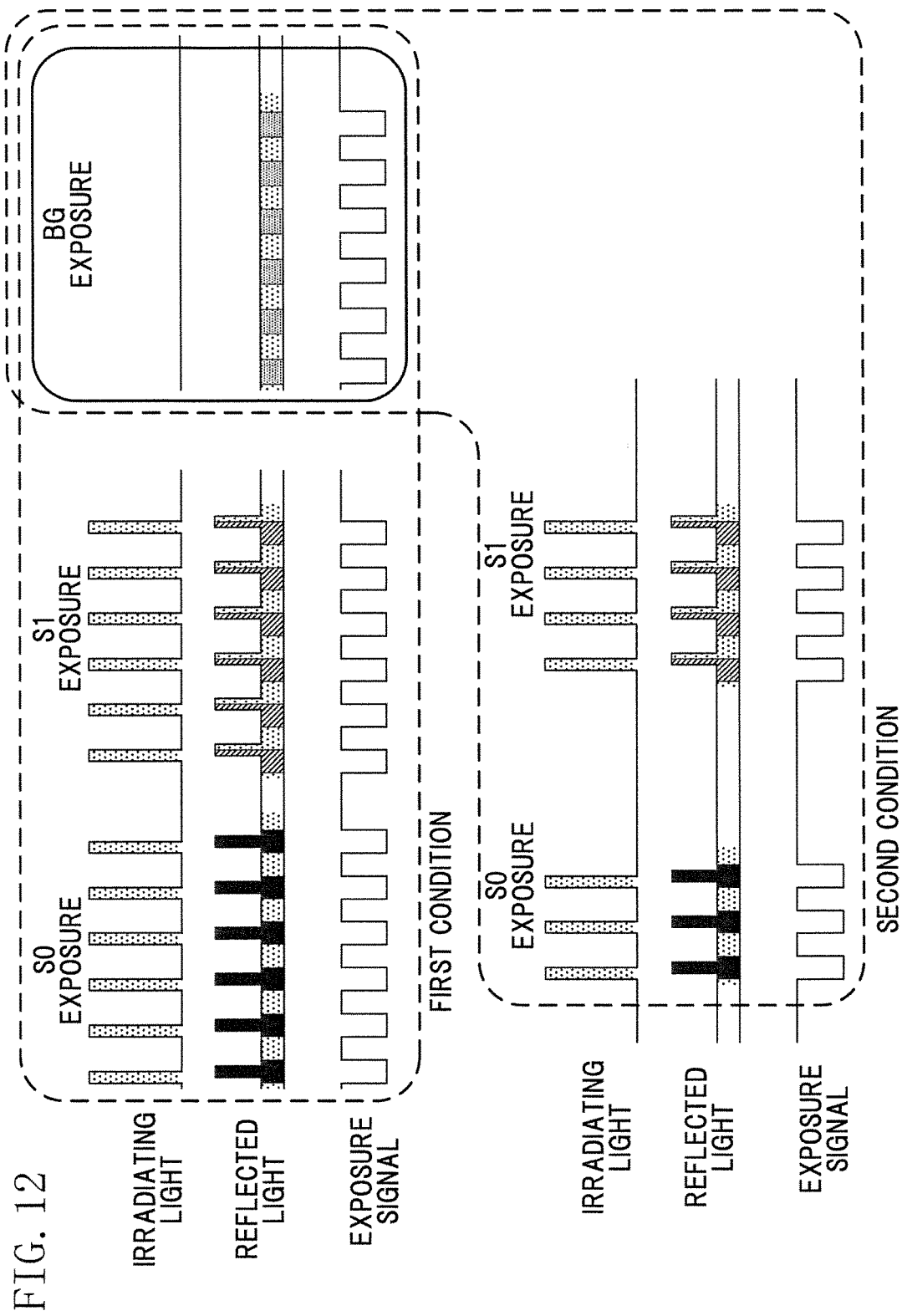
FIG. 12 illustrates an exemplary concept of sharing a background light exposure.

FIG. 12 illustrates an exemplary concept of sharing a background light exposure under multiple different measuring conditions. The background light exposure process does not require the light source to be turned ON, and thus the proportion of the background light remains constant even if the exposure condition changes. This allows for measuring the background light with calculations made at the same exposure ratio and with every pixel exposed at a time. Thus, as illustrated in FIG. 12, the BG exposure process may be shared in common between the measurements under the first and second conditions, for example. If the exposure process is shared, the background light exposure needs to be performed only once. This enables reducing the exposure time of the background light, and increasing the frame rate.

Second Embodiment

The distance measuring device may change conditions for exposure and light emission depending on the result of calculation of the output value of the solid-state image sensor. Such a configuration enables reflecting in real time the most suitable measurement condition on the object and measurement environment, and contributes to a measurement with even higher accuracy. In the second embodiment, the distance measuring device changes the measurement conditions based on the result of measurement.

Figure 13:
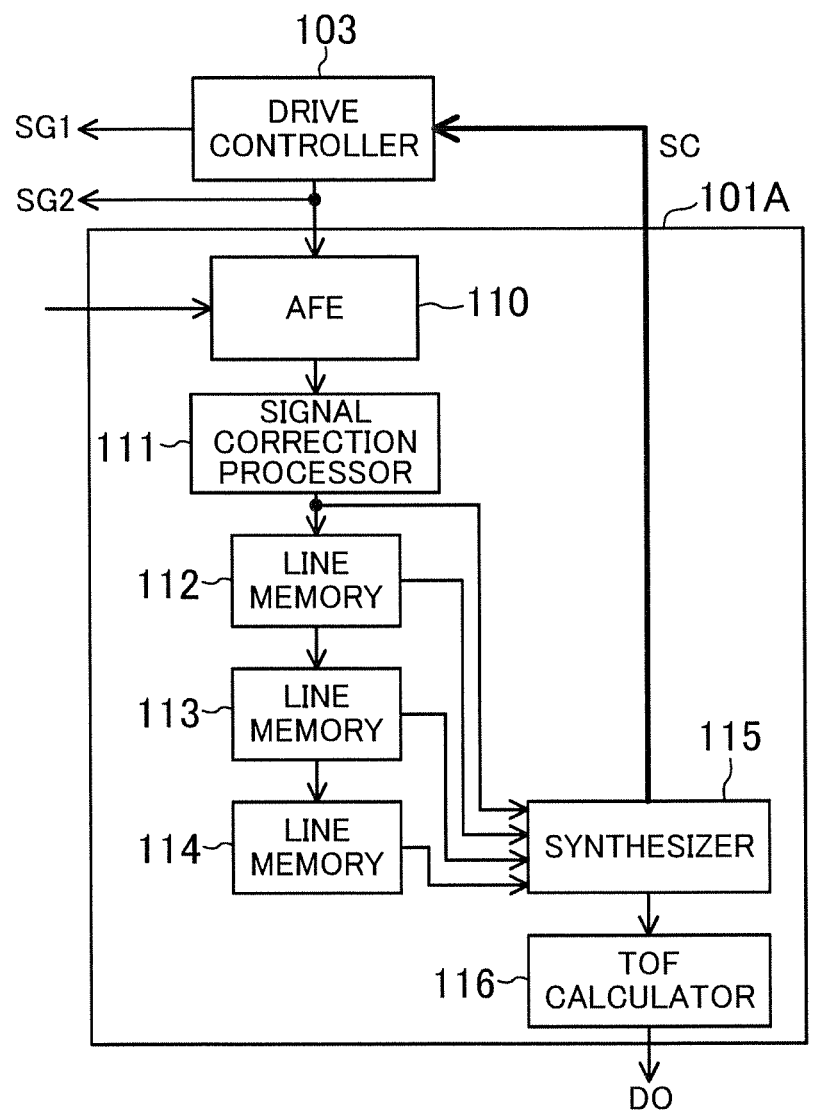
FIG. 13 illustrates a part of an exemplary configuration for a distance measuring device according to a second embodiment.

FIG. 13 is a block diagram illustrating a part of the configuration of a distance measuring device according to a second embodiment. Note that, in the second embodiment, description may be omitted as for any component having substantially the same function as its counterpart of the first embodiment to avoid redundancy. In FIG. 13, the synthesizer 115 in the imaging signal processor 101A performs an arithmetic operation on measurements under multiple conditions. Based on the result of the arithmetic operation, the synthesizer 115 instructs the drive controller 103 to adjust the measurement conditions, using a control signal SC. This enables measuring the distance while changing the measurement conditions in real time, and reflecting in real time the most suitable measurement condition on the object and measurement environment. As a result, the distance is readily measured with even higher accuracy.

Specifically, for example, adjustments may be made to the emission pulse width of the irradiating light and the number of times of exposure to the irradiating light. For example, if the distance calculated by the synthesizer 115 is shorter than the expected one, the synthesizer 115 instructs the drive controller 103 to narrow the emission pulse width of the irradiating light, using the control signal SC, such that the emission pulse width is set to be the most suitable one for measuring the distance to the object of measurement accurately. Meanwhile, if the distance calculated by the synthesizer 115 is longer than the expected one, the synthesizer 115 instructs the drive controller 103 to broaden the emission pulse width of the irradiating light, using the control signal SC, such that the emission pulse width is set to be the most suitable one for measuring the distance to the object of measurement accurately.

Furthermore, the synthesizer 115 may monitor the presence or absence of saturation or a saturated area, and may adjust the number of times of exposure based on the result of such monitoring. For example, the synthesizer 115 monitors the maximum value of the S0 signal under a condition involving a relatively large number of times of exposure, and instructs the drive controller 103 to adjust the number of times of exposure to avoid saturation, using the control signal SC. Alternatively, the synthesizer 115 monitors the area of a saturated region of the S0 signal under a condition involving a relatively small number of times of exposure. When the area exceeds a predetermined value, the synthesizer 115 instructs the drive controller 103 to decrease the number of times of exposure, using the control signal SC. On the other hand, if the area of the saturated region is smaller than another predetermined value, the synthesizer 115 instructs the drive controller 103 to increase the number of times of exposure, using the control signal SC.

Such controls enable setting a measurement condition suitable to the object and environment of measurement, such as the emission pulse width and the number of times of exposure, and thus contribute to measuring the distance with even higher accuracy.

Third Embodiment

Sometimes it may be difficult to arrange the light source and the solid-state image sensor in front of the object of measurement, depending on how to use the distance measuring device. For example, when the distance measuring device is used as a device which processes a gesture-based screen operation, a monitor is placed in front of its operator. Hence, it is difficult to place, in front of the operator, the distance measuring device for detecting the motion of a finger and the shape of a hand which point to the screen.

In the third embodiment, the light source and the solid-state image sensor are arranged to be spaced apart from each other in the distance measuring device. Also, the irradiating direction of the light source is tilted from the front side of the distance measuring device toward the solid-state image sensor. Specifically, the light source is positioned such that the irradiating light is incident obliquely on the object of measurement, and the solid-state image sensor is positioned in a direction in which the irradiating light is reflected. Such an arrangement allows for approximately equalizing, over the entire object of measurement, the amount of time it takes for the light emitted from the light source to irradiate the object, be reflected from the object and then be incident on the solid-state image sensor. Hence, the distance may be accurately measured.

Figure 14:
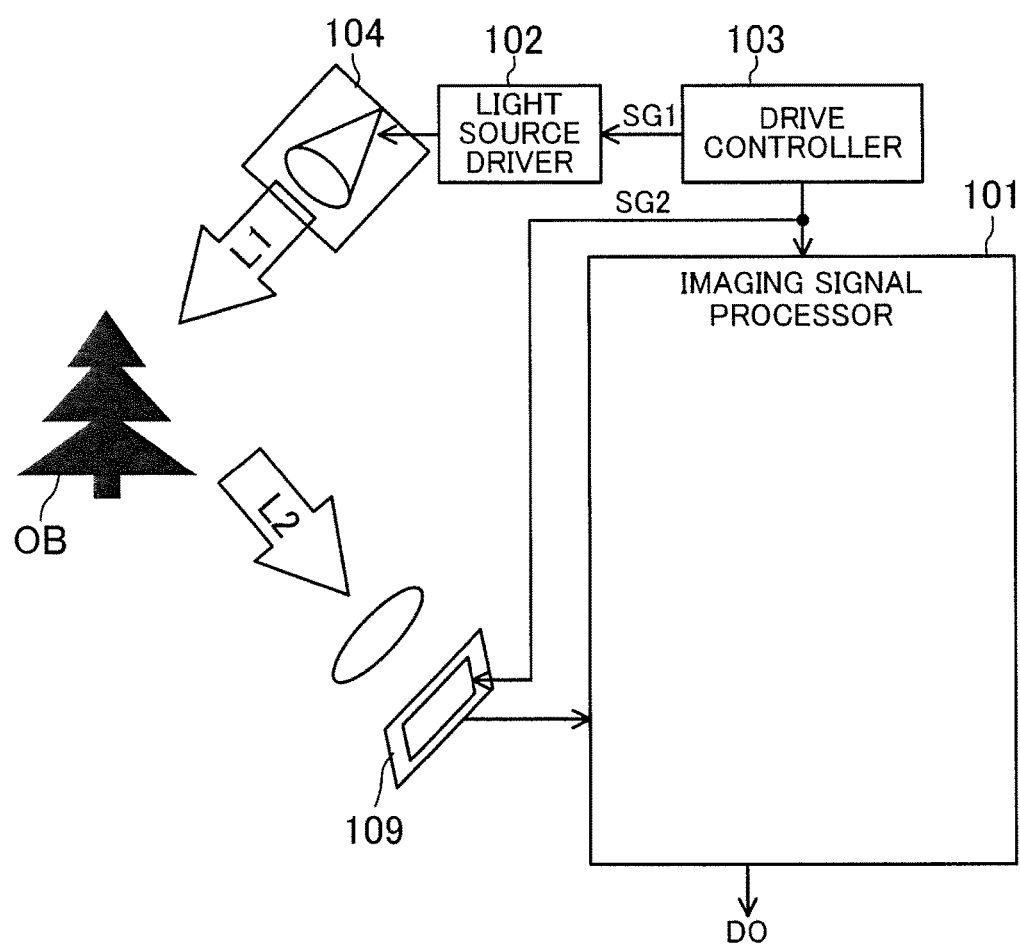
FIG. 14 illustrates an exemplary configuration for a distance measuring device according to a third embodiment.

FIG. 14 is a block diagram illustrating an exemplary configuration for a distance measuring device according to a third embodiment. Note that, in the third embodiment, description may be omitted as for any component having substantially the same function as its counterpart of the first embodiment to avoid redundancy. In the configuration illustrated in FIG. 14, the light source 104 and the solid-state image sensor 109 are arranged to be spaced apart from each other. In addition, the irradiating direction of the light source 104 is tilted from the front side of the distance measuring device toward the solid-state image sensor 109, such that the irradiating light L1 emitted from the light source 104 is incident obliquely on the object OB. Then, the solid-state image sensor 109 receives the light L2 reflected from the object OB. This configuration allows for approximately equalizing, over the entire object OB, the amount of time it takes for the irradiating light L1 emitted from the light source 104 to reach, as reflected light L2, the solid-state image sensor 109 after having been reflected from the object OB.

Figure 15A:
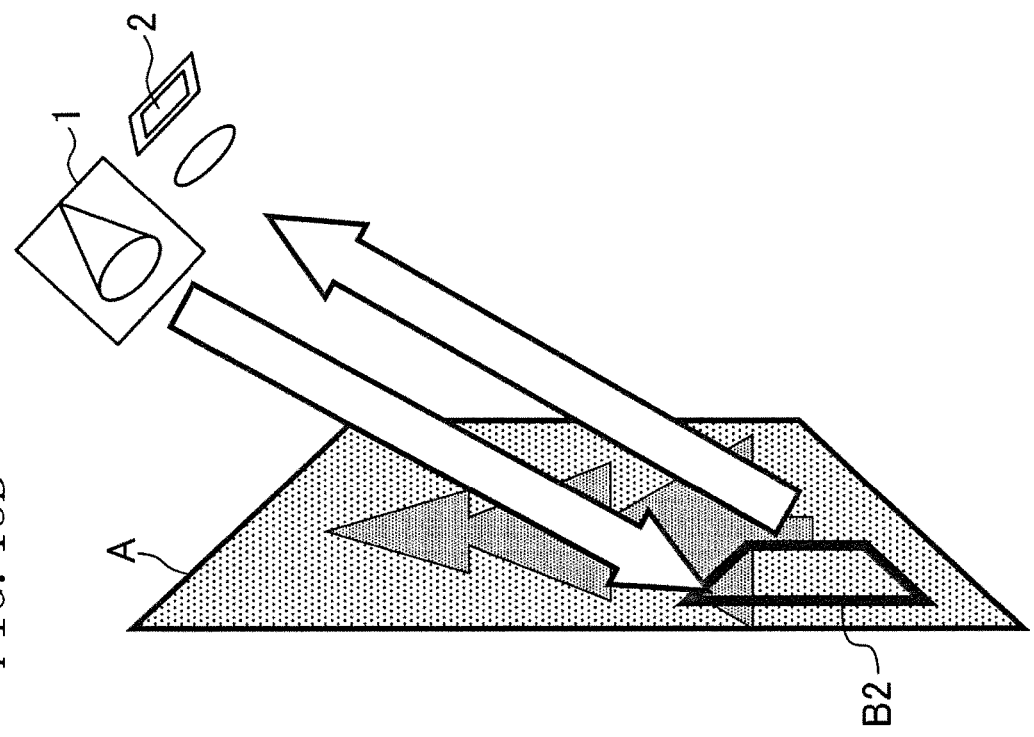
FIGS. 15A and 15B illustrate an effect to be achieved by the third embodiment.
Figure 15B:
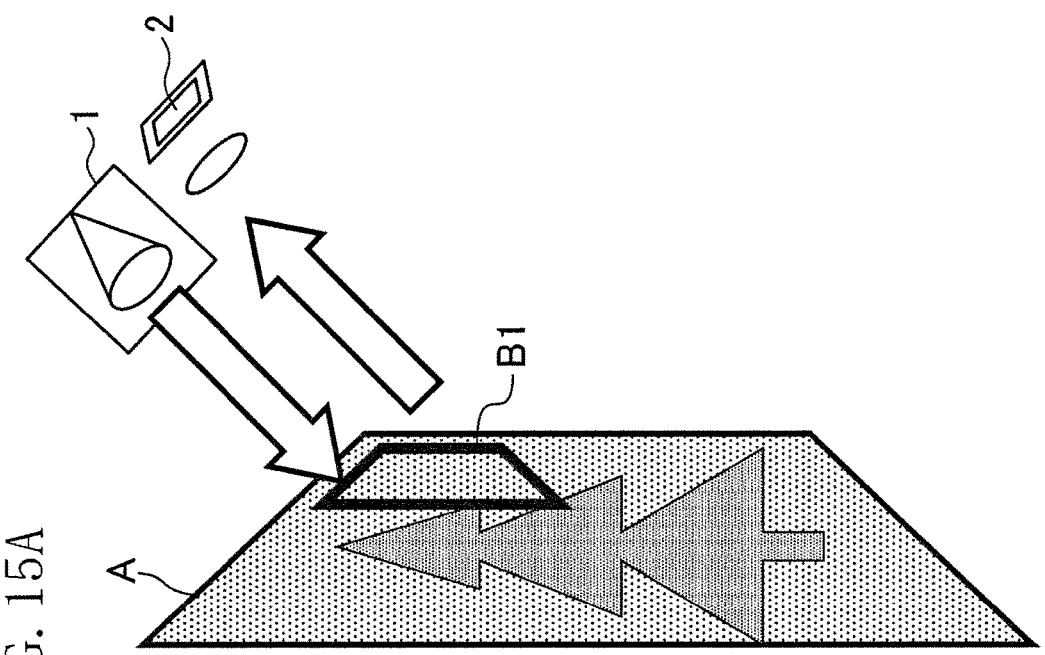

Such a configuration will be described with reference to FIGS. 15A and 15B, and FIGS. 16A and 16B. FIGS. 15A and 15B illustrate a situation where the light source and the solid-state image sensor are arranged at approximately the same position so as not to be spaced apart from each other. As shown in FIG. 15A, in the case of a region B1 close to the light source 1, the distance over which the irradiating light travels to the object A and the distance over which the reflected light returns to the solid-state image sensor 2 are both short. Meanwhile, as shown in FIG. 15B, in the case of a region B2 far away from the light source 1, the distance over which the irradiating light travels to the object A and the distance over which the reflected light returns to the solid-state image sensor 2 are both long. That is to say, the difference in the location of the region on the object A causes a big difference in measurement range.

Figure 16A:
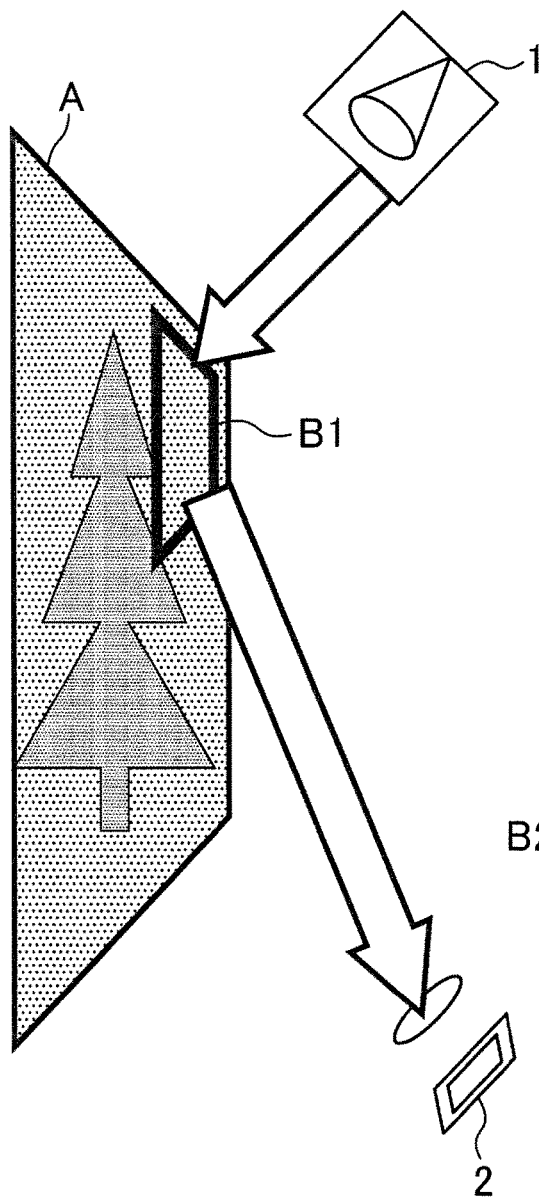
FIGS. 16A and 16B illustrate an effect to be achieved by the third embodiment.
Figure 16B:
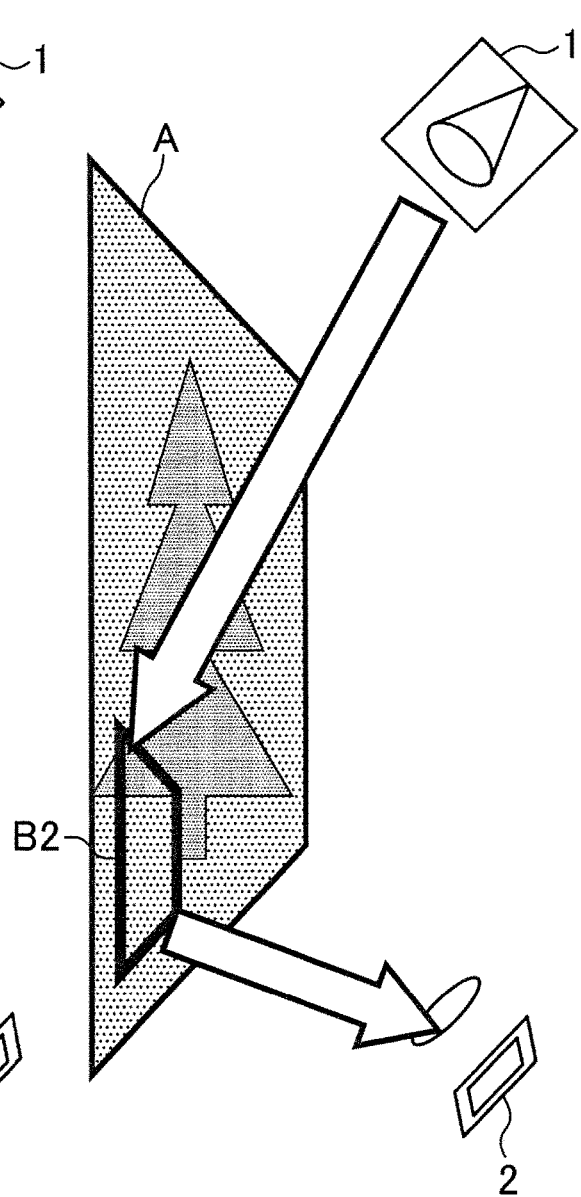

FIGS. 16A and 16B show a situation where the light source and the solid-state image sensor are arranged to be spaced apart from each other. As shown in FIG. 16A, in the case of the region B1 close to the light source 1, the distance over which the irradiating light travels to the object A is short. However, the distance over which the reflected light returns to the solid-state image sensor 2 is long. Meanwhile, as shown in FIG. 16B, in the case of a region B2 far away from the light source 1, the distance over which the irradiating light travels to the object A is long. However, the distance over which the reflected light returns to the solid-state image sensor 2 is short. That is to say, no significant difference is caused in measurement range even if the locations on the object A are different. This allows for narrowing the distance measuring range, and adapting the distance measuring device only to the narrowed range. Consequently, the distance may be measured with high accuracy.

Note that this embodiment is applicable to any distance measuring device other than that of the first embodiment.

The present disclosure is useful for reducing the size and cost of a distance measurement device which measures the distance to, and determines the shape of, an object of measurement. The present disclosure is applicable to, for example, an input device which detects a finger of a user who is performing a gesture input operation.

What is claimed is:

1. A distance measuring device which utilizes a time of flight (TOF) technique, the device comprising:
    a light source configured to emit light in accordance with an emission timing signal;
    a drive controller configured to generate, in accordance with a predetermined measurement condition, the emission timing signal and an exposure timing signal corresponding to the emission timing signal;
    a solid-state image sensor having a group of pixels arranged in a matrix pattern, the group being divided into a plurality of regions on a line-by-line basis, the solid-state image sensor performing an exposure process on a selected one of the regions in response to the exposure timing signal, and outputting, as a signal, charges stored in the group of the pixels; and
    an imaging signal processor configured to obtain distance information by performing an arithmetic operation on the signal output from the solid-state image sensor, wherein
    the drive controller generates the emission timing signal and the exposure timing signal for each of the plurality of regions of the solid-state image sensor in accordance with respective different measurement conditions, and uses, as the different measurement conditions, conditions that each specify a different parameter in terms of at least one selected from the group consisting of the number of times of exposure, an emission pulse width of the irradiating light and a phase of the exposure timing signal with respect to the emission timing signal, and
    a distance is respectively calculated using at least one of the different measurement conditions.

2. The device of claim 1, wherein:
    the group of the pixels of the solid-state image sensor is divided into a first region comprised of even-numbered lines and a second region comprised of odd-numbered lines,
    the different measurement conditions includes a first condition and a second condition, and
    the drive controller generates the emission timing signal and the exposure timing signal for the first region in accordance with the first condition, and also generates the emission timing signal and the exposure timing signal for the second region in accordance with the second condition which is different from the first condition.

3. The device of claim 2, wherein
    in the solid-state image sensor, the pixels on the even-numbered lines are shifted from the pixels on the odd-numbered lines by half a pixel in a line direction.

4. The device of claim 1, wherein
    the device performs distance measurements under a plurality of measurement conditions on a single region of the solid-state image sensor, wherein
    the imaging signal processor corrects the distance information based on a result of the arithmetic operation performed under the plurality of the measurement conditions.

5. The device of claim 1, wherein
    the device carries out a background light exposure process to capture an image without emitting light from the light source in common to distance measurements under a plurality of measurement conditions.

6. A distance measuring device which utilizes a time of flight (TOF) technique, the device comprising:
    a light source configured to emit light in accordance with an emission timing signal;
    a drive controller configured to generate, in accordance with a predetermined measurement condition, the emission timing signal and an exposure timing signal corresponding to the emission timing signal;

a solid-state image sensor having a group of pixels arranged in a matrix pattern, the group being divided into a plurality of regions on a line-by-line basis, the solid-state image sensor performing an exposure process on a selected one of the regions in response to the exposure timing signal, and outputting, as a signal, charges stored in the group of the pixels; and an imaging signal processor configured to obtain distance information by performing an arithmetic operation on the signal output from the solid-state image sensor, wherein the drive controller generates the emission timing signal and the exposure timing signal for each of the plurality of regions of the solid-state image sensor in accordance with respective different measurement conditions, and the imaging signal processor instructs the drive controller to adjust the measurement conditions based on a result of the arithmetic operation.

7. The device of claim 6, wherein the imaging signal processor instructs the drive controller to narrow an emission pulse width of the irradiating light if the distance information obtained based on the result of the arithmetic operation is shorter than a first predetermined distance and to broaden the emission pulse width of the irradiating light if the distance information obtained based on the result of the arithmetic operation is longer than a second predetermined distance.

8. The device of claim 6, wherein the imaging signal processor monitors the output of the solid-state image sensor for a presence or absence of saturation or an area of a saturated region, and, based on a result of this monitoring, instructs the drive controller to adjust the number of times of exposure.

9. A solid-state image sensor to be used for a distance measuring device which utilizes a TOF (time of flight) technique, the distance measuring device including:

a light source configured to emit light in sync with an emission timing signal;

a drive controller configured to generate, in accordance with a predeteriniined measurement condition, the emission timing signal and an exposure timing signal corresponding to the emission timing signal; and an imaging signal processor configured to perform an arithmetic operation on the signal output from the solid-state image sensor, and obtain distance information, the drive controller generating the emission timing signal and the exposure timing signal for each of the plurality of regions of the solid-state image sensor in accordance with respective different measurement conditions, and using, as the different measurement conditions, conditions that each specify a different parameter in terms of at least one selected from the group consisting of the number of times of exposure, an emission pulse width of the irradiating light and a phase of the exposure timing signal with respect to the emission timing signal, a distance being respectively calculated using at least one of the different measurement conditions, and the solid-state image sensor comprising a group of pixels arranged in a matrix pattern, the group being divided into a plurality of regions on a line-by-line basis, the solid-state image sensor performing an exposure process on a selected one of the regions in response to the exposure timing signal, and outputting, as a signal, charges stored in the group of the pixels.

10. The sensor of claim 9, wherein the group of the pixels is divided into a first region comprised of even-numbered lines and a second region comprised of odd-numbered lines.

11. The sensor of claim 10, wherein in the solid-state image sensor, the pixels on the even-numbered lines are shifted from the pixels on the odd-numbered lines by half a pixel in a line direction.

12. The sensor of claim 9, wherein the sensor performs distance measurements under a plurality of measurement conditions on a single region of the sensor.

* * * * *